United States Patent [19]
Takahashi

[11] Patent Number: 5,384,505
[45] Date of Patent: Jan. 24, 1995

[54] DELAYED-PULSE GENERATOR HAVING MEANS FOR STABILIZING THE CHARGING CURRENT

[75] Inventor: Tetsuya Takahashi, Kanagawa, Japan

[73] Assignee: NEC Corporation, Japan

[21] Appl. No.: 212,395

[22] Filed: Mar. 10, 1994

Related U.S. Application Data

[63] Continuation of Ser. No. 852,408, Mar. 16, 1992, abandoned.

[30] Foreign Application Priority Data

Mar. 18, 1991 [JP]  Japan ................................. 3-052024

[51] Int. Cl.⁶ .......................... H03K 5/159; G05F 3/16
[52] U.S. Cl. ..................... 327/262; 323/315; 327/261; 327/263; 327/264; 327/77
[58] Field of Search .............. 307/603, 605, 608, 597, 307/494, 296.1, 354, 362; 328/55; 323/315

[56] References Cited
U.S. PATENT DOCUMENTS

| | | | |
|---|---|---|---|
| 4,503,381 | 3/1985 | Bowers | 323/315 |
| 4,803,381 | 2/1989 | Gornati et al. | 323/315 |
| 5,063,342 | 11/1991 | Hughes et al. | 323/315 |

*Primary Examiner*—Timothy P. Callahan
*Assistant Examiner*—Trong Phan
*Attorney, Agent, or Firm*—Laff, Whitesel, Conte & Saret, Ltd.

[57] ABSTRACT

A delayed-pulse generator formed by a combination of a comparator, a current-mirror circuit, a capacitor, a switching transistor and a constant-current source further has a transistor whose emitter and base are connected together and which is connected in parallel and in forward-direction with respect to the constant-current source. A charging current of a very small value can be set stably without being affected by the leakage current flowing in the switching transistor even in a high temperature operation. Thus, a pulse having a long delay time can be readily obtained. In addition, an erroneous operation caused by the leakage current flowing in the switching transistor can be effectively suppressed.

3 Claims, 2 Drawing Sheets

DELAYED-PULSE GENERATOR HAVING MEANS FOR STABILIZING THE CHARGING CURRENT

This application is a continuation of application Ser. No. 07/852,408, filed Mar. 16, 1992, now abandoned.

BACKGROUND OF THE INVENTION

1. Field of the invention

The present invention relates to delayed-pulse generators and, more particularly, to a delayed-pulse generator In the form of a semiconductor integrated circuit.

2. Description of the Related Art

A conventional delayed-pulse generator of the type to which the present invention relates is shown in FIG. 1. The conventional generator comprises a current-mirror circuit 1 formed by PNP-type transistors Q1, Q2 and resistors R1, R2; a comparator circuit 2; a constant-current source 3 for setting an output current of the current-mirror circuit 1; a reference voltage source 4 connected to one input terminal of the comparator circuit 2, for setting a threshold voltage thereof; a capacitor C1 having one end grounded and the other end connected to the other input terminal of the comparator circuit 2 and charged by the output current from the current-mirror circuit 1; and an NPN-type transistor Q3 with the base thereof connected to a resistor R3, for discharging the charge in the capacitor C1.

The operation of this delayed-pulse generator will be described with reference to FIG. 2 which is a time chart illustrating the operation of the delayed-pulse generator. When an input pulse $P_{IN}$ applied to the base of the transistor Q3 through the resistor R3 changes its level from a high "H" to a low "L" at a predetermined timing, the transistor Q3 is turned off accordingly. As a result, the capacitor C1 starts to be charged by the output current I1 supplied from the current-mirror circuit 1, the value of the output current I1 being established by the constant-current source 3. With this charging of the capacitor C1, the potential at a node E is increased as shown in FIG. 2. When this voltage at the node E exceeds the threshold voltage $V_T$ of the comparator circuit 2 as set by the reference voltage source 4, the comparator circuit 2 operates to output an output pulse $P_{OUT}$ of "H" level at its output terminal $T_{OUT}$.

The delay time (td) between the input pulse $P_{IN}$ and the output pulse $P_{OUT}$ can be expressed by the following Equation (1):

$$td = (C1 \cdot V_T)/I1 \quad (1)$$

where C1 represents the capacitance of the capacitor C1.

As can readily be understood from the above Equation (1) that, in order to obtain a long delay time, it is necessary to select a high capacitance for the capacitor C1 or set the charging current I1 small. Generally, it is difficult to make large the capacitance of the capacitor formed in an integrated circuit. The upper limit of the capacitance is about 30 pF, although it more or less depends on the chip area.

A case of realizing a long delay time with a low charging current I1 will now be described. Assuming that the capacitance C1 to be 30 pF and the reference voltage $V_T$ to be 3.0 V, for obtaining a delay time of 10 msec., the charging current I1 has to be set to a very small value of about 0.9 nA.

Here, there is flowing a leakage current $I_{L3}$ in the switching transistor Q3 for the capacitor C1. When the junction temperature of the transistor Q3 is 25° C., the leakage current is about 0.2 pA. However, it is doubled with each temperature rise by 8°~10° C. and acts to subtract itself from the charging current I1 to flow into the capacitor C1. As a consequence, the delay time (td) is increased in accordance with the increase in the junction temperature as shown by the curve B in FIG. 3. At 125° C., the leakage current $I_{L3}$ is about 1 nA. This value is substantially the same as the value of the charging current I1 noted above. This means that, at the temperature of 125° C., the charging current I1 towards the capacitor C1 from the current-mirror circuit 1 is consumed entirely as leakage current which flows in the transistor Q3. In this state, the capacitor C1 is not charged, so that the potential at the node E remains at 0 volt. Therefore, even where the "L" level input pulse $P_{IN}$ is applied to the input terminal $T_{IN}$ in this state, the comparator circuit 2 remains inoperative, and the desired output pulse $P_{OUT}$ is not provided.

As explained hereinabove, with the above conventional delayed-pulse generator, the capacitance of the capacitor in the integrated circuit cannot be made large and, for making the delay time long, it is necessary to set a small current value of the constant-current source. This means that in a high temperature operation the leakage current of the switching transistor makes it difficult to set a long delay time. Besides, the leakage current of the switching transistor eventually causes erroneous operation. These are problems in the conventional delayed-pulse generator to be solved.

SUMMARY OF THE INVENTION

It is, therefore, an object of the invention to overcome the problems existing in the conventional delayed-pulse generator and to provide an improved delayed-pulse generator, which permits setting of a long delay time without being affected by the leakage current in the switching transistor even in a high temperature operation.

It is another object of the invention to provide a delayed-pulse generator, which can suppress erroneous operation caused by the leakage current in the switching transistor.

According to one aspect of the present invention, there is provided a delayed-pulse generator which comprises:

a comparator circuit having a first input terminal receiving a reference voltage which sets a threshold voltage thereof, for providing a pulse when an input potential at a second input terminal thereof exceeds the reference voltage;

a capacitor having one end grounded and the other end connected to the second input terminal of the comparator circuit;

a current-mirror circuit for outputting an output current which charges the capacitor;

a first NPN-type transistor for discharging the capacitor with a predetermined timing;

a constant-current source for setting the output current supplied from the current-mirror circuit; and a second NPN-type transistor whose base and emitter connected together and which is connected in parallel and in forward-direction with respect to the constant-current source.

BRIEF DESCRIPTION OF THE DRAWINGS

The above and other objects, features and advantages of the invention will become more apparent from the following description when the same is read with reference to the accompanying drawings, in which.

PREFERRED EMBODIMENT OF THE INVENTION

Now, an embodiment of the invention will be described with reference to the accompanying drawings.

Figure 4:
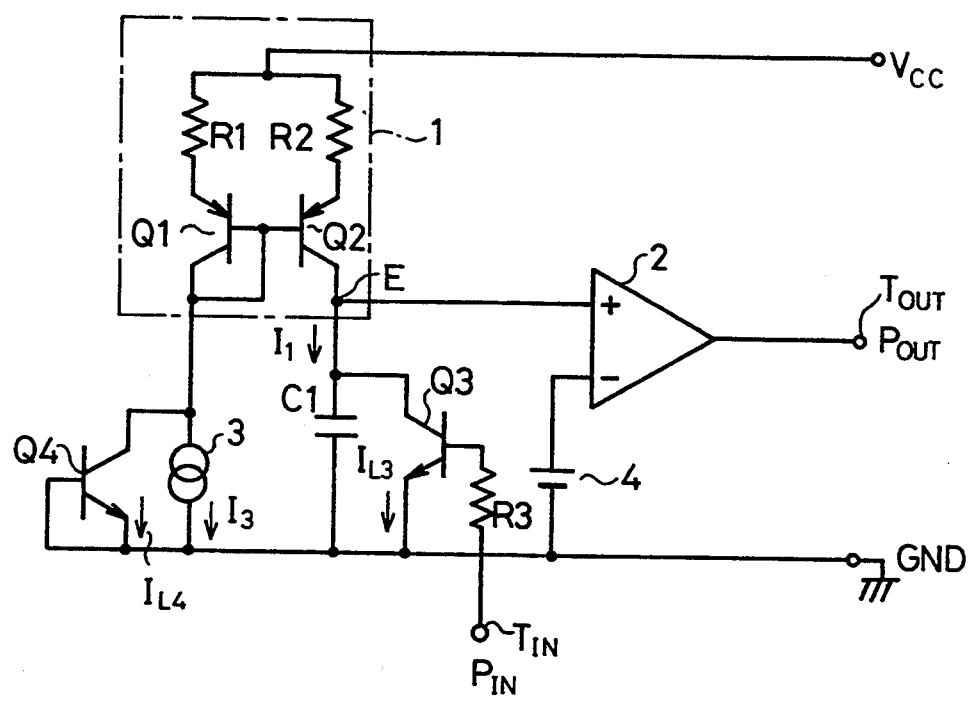
FIG. 4 is a circuit diagram showing an embodiment of the delayed-pulse generator according to the invention.

FIG. 4 is a circuit diagram showing an embodiment of the delayed-pulse generator according to the invention.

As shown in FIG. 4, the delayed-pulse generator of the embodiment according to the invention, like the above-explained conventional generator, comprises a current-mirror circuit 1 formed by PNP-type transistors Q1, Q2 and resistors R1, R2; a comparator circuit 2; a constant-current source 3 for setting the output current I1 of the current-mirror circuit 1; a reference voltage source 4 which is connected to one input terminal of the comparator circuit 2 and which is for setting a threshold voltage thereof; a capacitor C1 having one end grounded and the other end connected to the other input terminal of the comparator circuit 2; and an NPN transistor Q3 with the base thereof connected to a resistor R3, for discharging the charge in the capacitor C1. It should be noted that, in addition to the above structure, it further comprises an NPN-type transistor Q4 in which the emitter and base thereof are connected together and which is connected in parallel to the constant-current source 3.

The operation of the embodiment will now be described. As the general operation of the delayed-pulse generator is common to that in the conventional circuit, it is not repeated here.

It can generally be said that, in the transistors having the same size and the same conductivity type within the same integrated circuit, i.e., the NPN-type transistors Q3, Q4 in this embodiment, an equal leakage current flows therein from the collector to the ground of the p-type substrate.

On the assumption that the leakage current in the transistor Q3 is $I_{L3}$ and the leakage current In the transistor Q4 is $I_{L4}$, the relationship therebetween can be expressed in the following Equation (2):

$$I_{L3} = I_{L4} \tag{2}$$

The charging current I1 for the capacitor C1 at this time can be expressed by the following Equation (3):

$$I1 = A(I3 + n \cdot I_{L4}) - m \cdot I_{L3} \tag{3}$$

where A is the current gain of the current-mirror circuit 1 and I3 is the current value of the constant-current source 3. Denoting the collector-substrate junction areas of the transistors Q3 and Q4, respectively, by m and n, and setting n=m/A, the charging current I1 is expressed by the following Equation (4):

$$I1 = A \cdot I3 \tag{4}$$

It will be appreciated from the above Equation (4) that the charging current I1 is not affected by the leakage current $I_{L3}$ flowing in the switching transistor Q3 and can be held substantially at a constant value.

Figure 1:
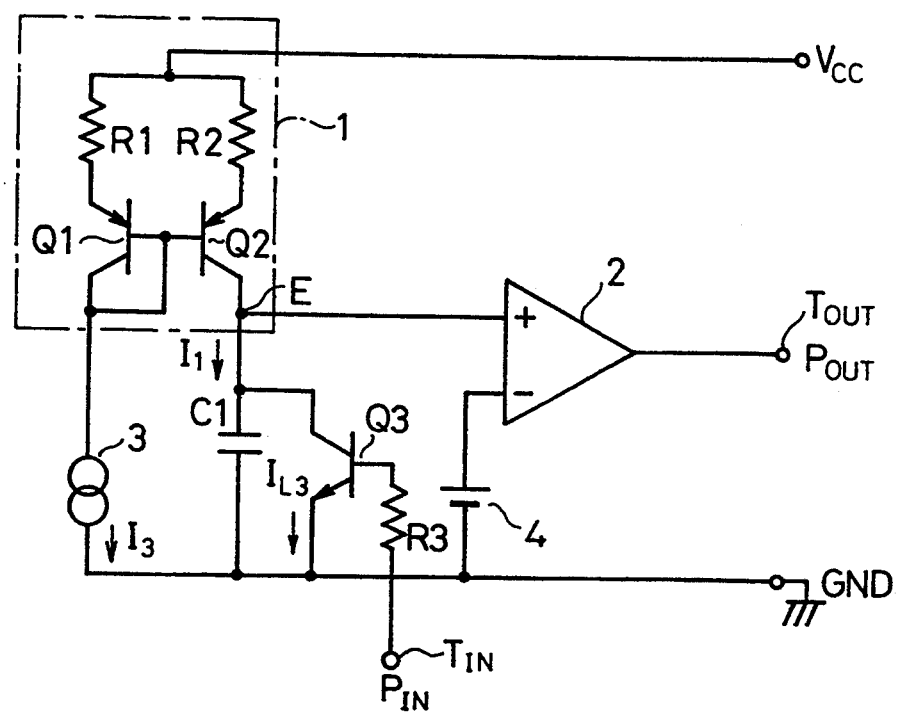
FIG. 1 is a circuit diagram showing a conventional delayed-pulse generator.
Figure 2:
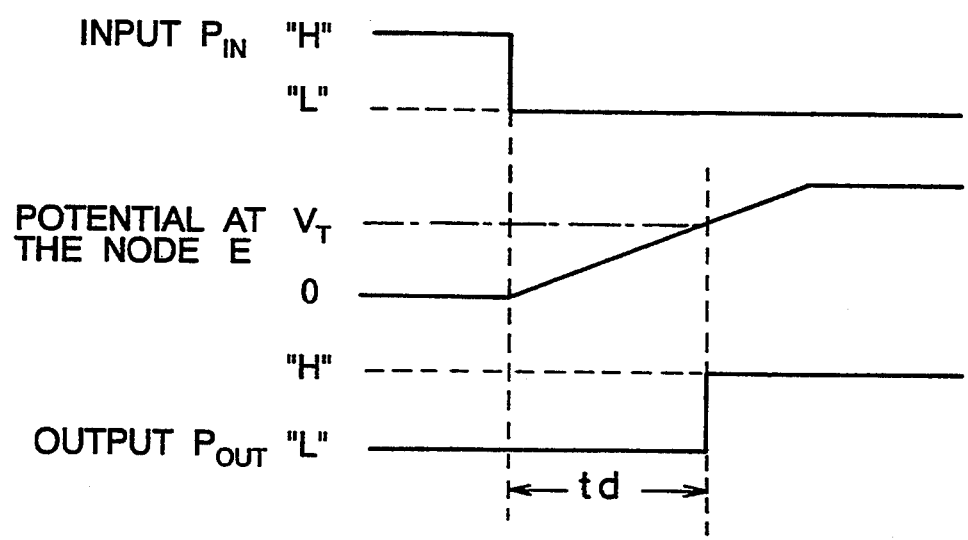
FIG. 2 is a time chart for explaining the operation of the delayed-pulse generator according to the invention and that in the conventional generator.
Figure 3:
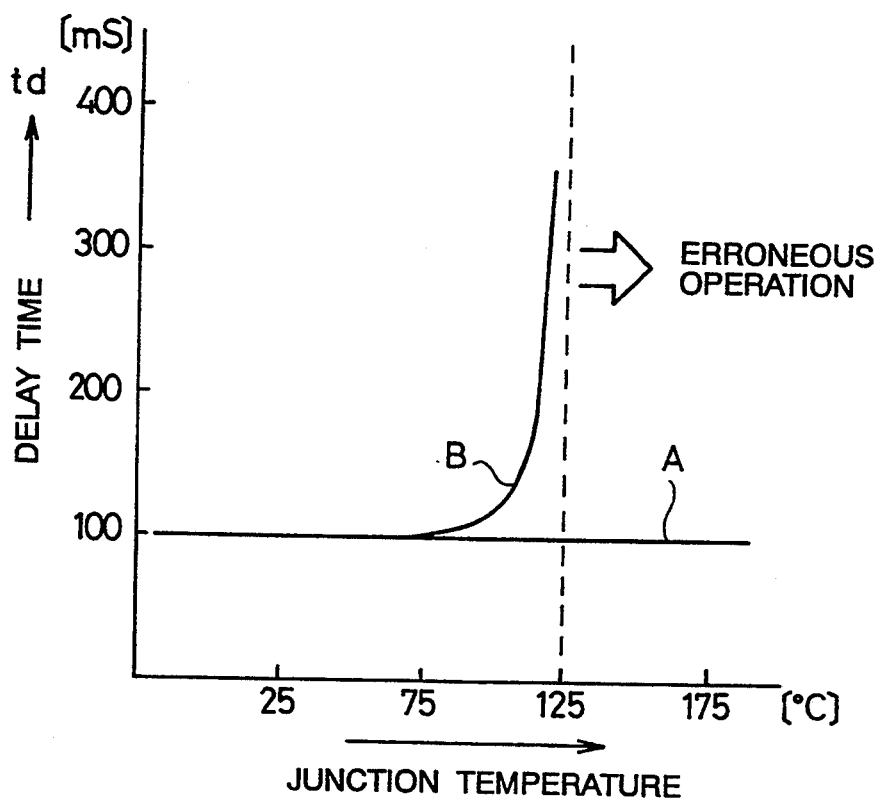
FIG. 3 is a graph showing the characteristics of the delay time with respect to the temperature, of the delayed-pulse generator according to the invention and that in the conventional generator.

Thus, a delay time (td) can be held constant irrespective of an increase in a junction temperature, as shown by the curve A in FIG. 3.

While a preferred embodiment has been described, it is by no means limitative, and various changes and modifications are possible without departing from the scope and spirit of the invention. For example, while in the above embodiment, A, m and n were set as A=1, n=m, it is possible to set other values, for instance, A=0.5, m=1 and n=2, as is obvious from the above Equations (3) and (4). In this case, the charging current I1 can be varied without varying the current value in the constant-current source, which is very useful in effect.

As has been described in the foregoing, the delayed-pulse generator according to the invention has a transistor in which the emitter and base thereof tied together and which is connected in parallel and in the forward-direction with respect to the constant-current source. Thus, it is possible to set a very small charging current for the capacitor stably and without being affected by the leakage current in the switching transistor in a high temperature operation. A long delay time to be desired thus can be readily realized. In addition, It is possible to suppress erroneous operations caused by the leakage current which flows in the switching transistor.

What is claimed is:

1. A delayed-pulse generator comprising:
   a first and a second power supply terminal;
   a comparator circuit having a first input terminal coupled to receive a reference voltage which sets a threshold voltage therefor, said comparator circuit providing a pulse when an input potential at a second input terminal thereof exceeds said reference voltage;
   a capacitor having one end connected to said second power supply terminal, the other end of said capacitor being connected to said second input terminal of said comparator circuit;
   a current-mirror circuit coupled to output an output current which charges said capacitor;
   a first transistor for discharging said capacitor with a predetermined timing;
   a constant-current source connected between said current-mirror circuit and said second power supply terminal, for setting said output current supplied from said current-mirror circuit; and
   a second transistor connected in parallel and in a forward-direction with respect to said constant-current source said second transistor having a leakage current which is the same as said leakage current of said first transistor so that said capacitor is enabled to be charged by said output current without being affected by a leakage current of said first transistor.

2. The delayed-pulse generator according to claim 1, in which said first and second transistors are NPN-type transistors, said second transistor having a base and an emitter connected in common to said second power supply terminal and having a collector connected to a junction node between said current-mirror circuit and said constant-current source.

3. The delayed-pulse generator according to claim 1, in which a relationship $n = m/A$ is satisfied where m and n respectively represent collector-substrate junction areas of said first and second transistors and A represents the current gain of the current-mirror circuit.

* * * * *